United States Patent [19]

Talneau et al.

[11] Patent Number: 5,357,538

[45] Date of Patent: Oct. 18, 1994

[54] DISTRIBUTED FEEDBACK LASER STRUCTURE

[75] Inventors: Anne Talneau, Paris; Josette Charil, Meudon, both of France

[73] Assignee: France Telecom, Paris, France

[21] Appl. No.: 51,057

[22] Filed: Apr. 21, 1993

[30] Foreign Application Priority Data

Apr. 24, 1992 [FR] France .................. 92 05076

[51] Int. Cl.5 .................. H01S 3/08; H01S 3/19
[52] U.S. Cl. ........................... 372/96; 372/46
[58] Field of Search ..................... 372/96, 45, 46

[56] References Cited

FOREIGN PATENT DOCUMENTS 0321328 6/1989 European Pat. Off. .
0390614 10/1990 European Pat. Off. .
0461632 12/1991 European Pat. Off. .

OTHER PUBLICATIONS

Morthier et al., "A Dow DFB-Laser Disk with Reduced Spatial Hole Burning", IEEE Photonics Technology Letters, vol. 2 No. 6, Jun. 1990, pp. 388–390.
Y. Nakano et al., "Analysis, Design, and Fabrication of GaAlAs/GaAs DFB Lasers . . . ", IEEE Journal of Quantum Electronics, vol. 24, No. 10, Oct. 1988, pp. 2017–2337.

*Primary Examiner*—James W. Davie
*Attorney, Agent, or Firm*—Blakely, Sokoloff, Taylor & Zafman

[57] ABSTRACT

A distributed feedback semiconductor laser structure of the type having a guidance zone providing lateral guidance by refractive index variation, including a phase-shifting diffraction grating extending between two end regions along a light propagation direction, for obtaining coupling within the structure between light propagating in one direction and light propagating in the opposite direction. The diffraction grating is adapted to implement coupling of varying amplitude along the structure between said end regions, and the width of said guidance zone varies such that the phase shift induced by said variation in width compensates for the phase shift induced by the variation in the coupling amplitude.

15 Claims, 5 Drawing Sheets

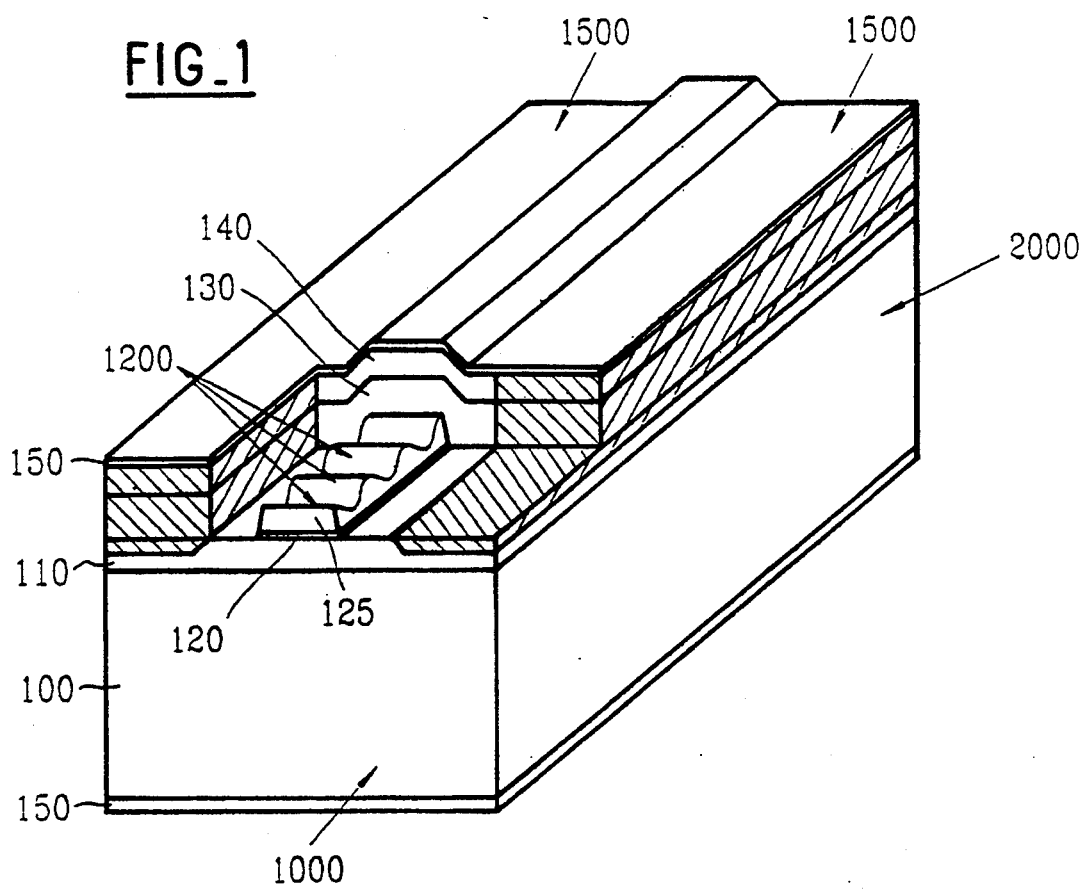
FIG_1
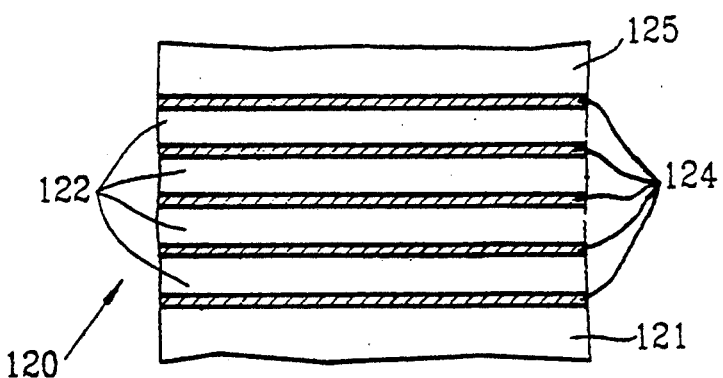
FIG_1a

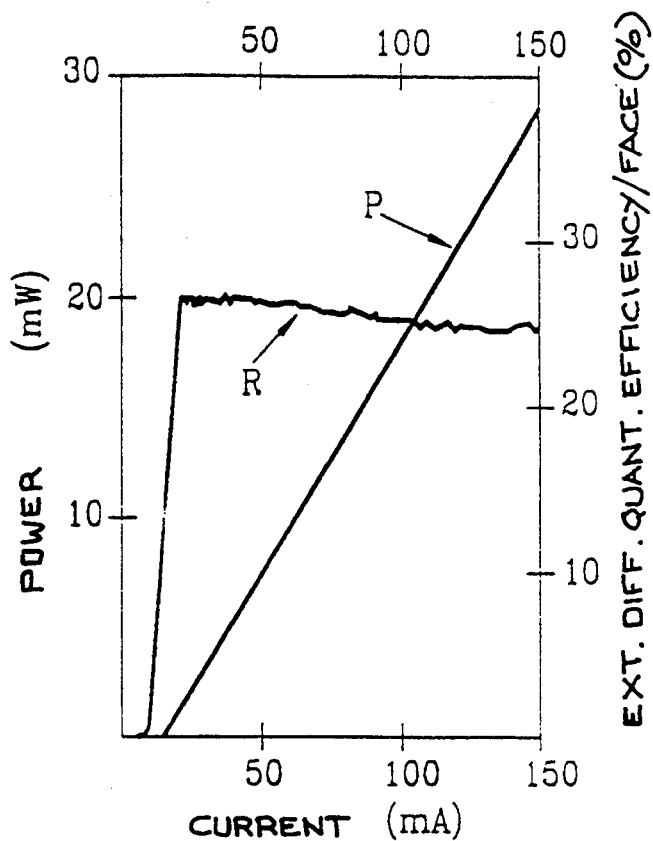
FIG_3
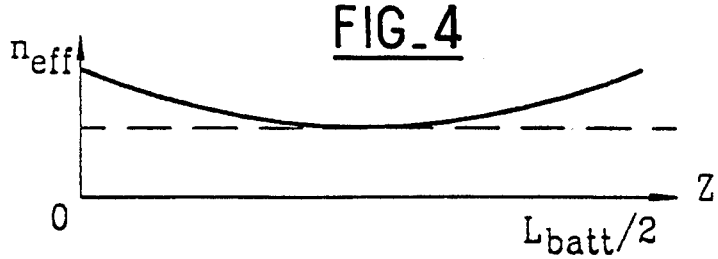
FIG_4
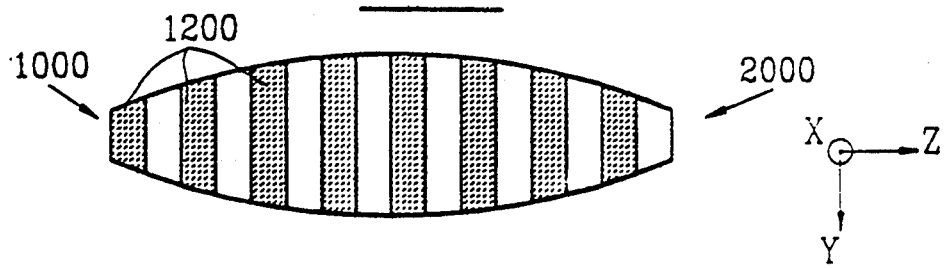
FIG_6
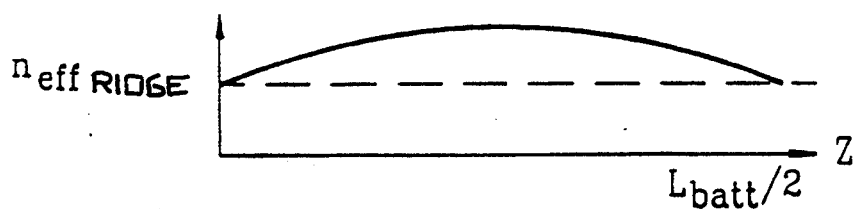
FIG_7

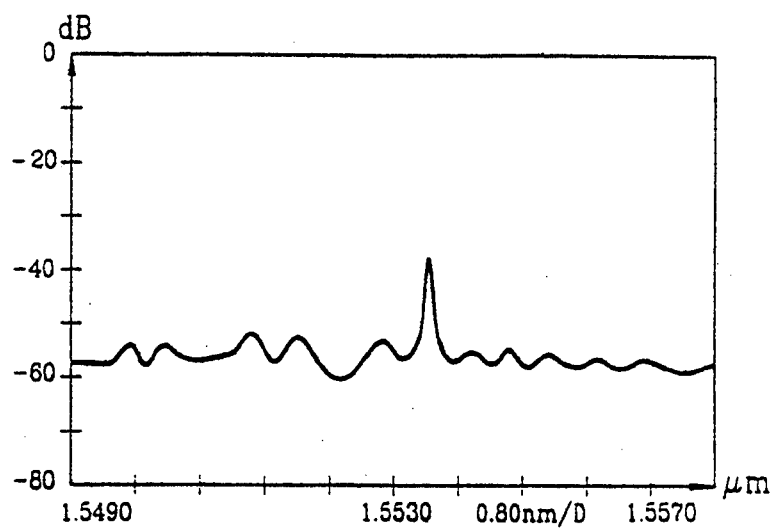
FIG_5a
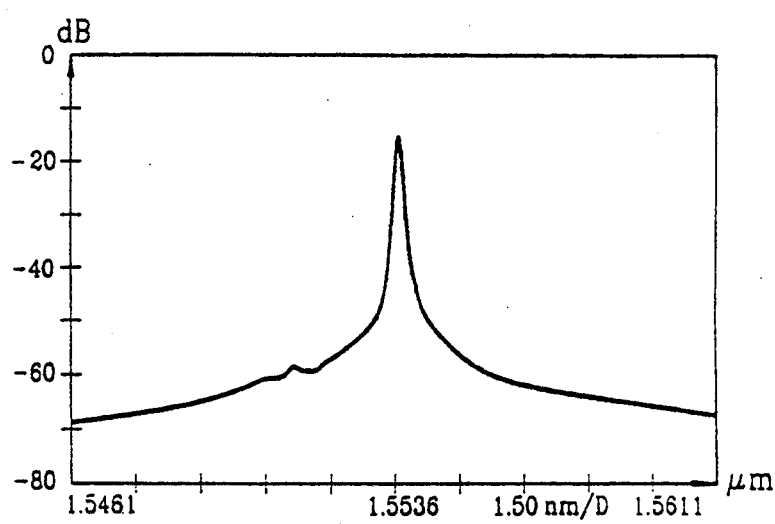
FIG_5b
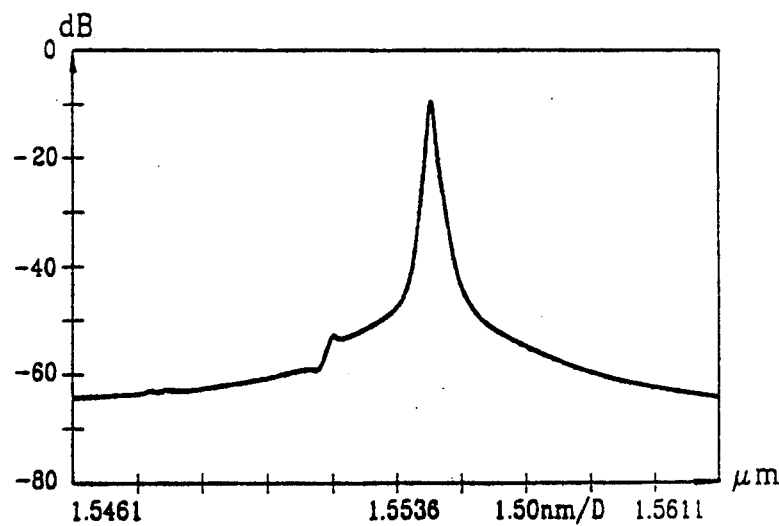
FIG_5c

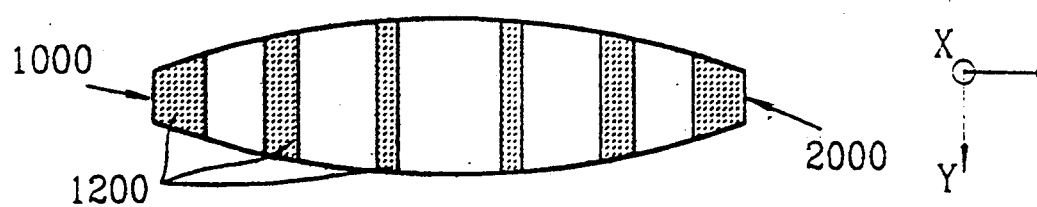
FIG_8
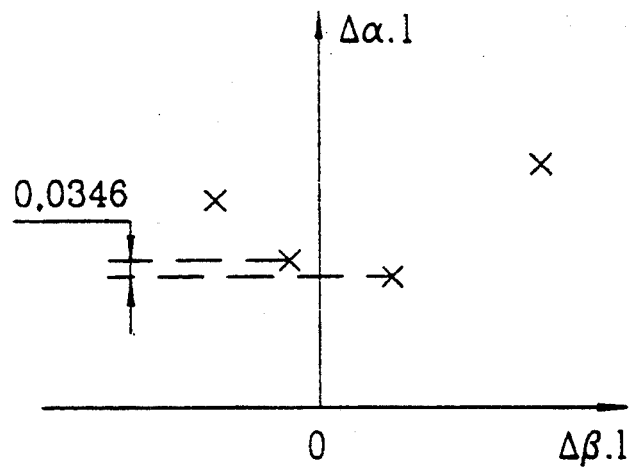
FIG_9a
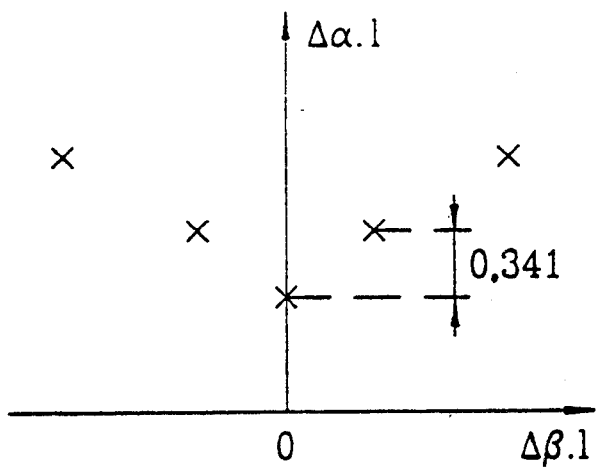
FIG_9b

DISTRIBUTED FEEDBACK LASER STRUCTURE

The present invention relates to semiconductor laser structures, and more particularly to a distributed feedback (DFB) laser structure.

BACKGROUND OF THE INVENTION

In the field of optical telecommunications, it is desirable to increase the data rate conveyed by light, and one of the means used for achieving that object consists in using light sources that are more and more monochromatic. Distributed feedback laser diodes have narrow spectrum width and have appeared as particularly good light sources.

In laser diodes of this type, the light feedback necessary for the lasing phenomenon comes from Bragg backscattering that results from periodic disturbance of the refractive index of a region in the structure of the diode in which the lightwave propagates. To do this, a diffraction grating is made that includes patterns distributed along the structure, said patterns generally extending transversely to the propagation direction of the light.

In conventional distributed feedback laser diodes, the diffraction grating provides constant amplitude coupling between light propagating in one direction (the "go" wave) and light propagating in the opposite direction (the "return" wave).

At a high level of emitted power, instabilities are observed in the operation of conventional laser diodes which give rise to the appearance of longitudinal secondary modes that are superposed on the main mode, with the drawback of spoiling the performance of such laser diodes, in particular by broadening the emission spectrum and by degrading the linearity of the emitted power response as a function of injected current. This instability phenomenon known by the term "hole-burning" is the result mainly of non-uniformity in the electrical field of the lightwave along the structure.

Various structures have been proposed to improve the performance of conventional laser diodes, and to limit the "hole-burning" phenomenon.

In an article entitled "Long cavity, multiple-phase shift, distributed feedback laser for linewidth narrowing" published in Electronics Letters Vol. 25, No. 10, pp. 629–630, 1989, Ogita et al. propose implementing a plurality of phase shifts along the grating. However, the Ogita study is restricted to short laser structures, about 500 μm long, since the instabilities due to "hole-burning" tend to increase with the length of the structure. Unfortunately, it appears to be advantageous to implement structures of greater length since the monochromaticity of the emitted spectrum improves considerably when the length of the structure is increased.

In an article entitled "Corrugation-pitch-modulated phase-shifted DFB laser", published in IEE Photonics Technology Letters, Vol. 1, No. 8, August 1989, Okai et al. describe a structure having a length of 1.2 mm. Okai proposes modulating the period of the grating to guarantee stable operation. However, although the "hole-burning" phenomenon is considerably reduced, it is not completely eliminated.

Other authors have proposed different approaches to counter this problem of "hole-burning". One such article entitled "A new DFB-laser diode with reduced spatial hole-burning" published in IEE Photonics Technology Letters, Vol. 2, No. 6, June 1990, by Morthier et al. shows that it is theoretically possible to improve the distribution of the electric field of the lightwave within the structure and thereby reduce the "hole-burning" phenomenon by varying coupling amplitude, such that the coupling is at a minimum in the center of the structure.

However, the Morthier study is limited to short structures, about 300 μm long, delimited by faces with anti-reflection treatment. Morthier observes that coupling modulation is accompanied by a phase shift of the lightwave in the structure which prevents the laser from oscillating at the Bragg frequency, with the drawback of leading to low rejection of secondary modes. The author neither proposes nor suggests any solutions for attempting to remedy that drawback.

OBJECTS AND SUMMARY OF THE INVENTION

An object of the invention is to propose an improved laser structure that remedies the above-mentioned drawbacks.

To this end, the invention provides a distributed feedback semiconductor laser structure of the type having a guidance zone providing lateral guidance by refractive index variation, including a phase-shifting diffraction grating extending between two end regions along a light propagation direction, for obtaining coupling within the structure between light propagating in one direction and light propagating in the opposite direction, wherein the diffraction grating is adapted to implement coupling of varying amplitude along the structure between said end regions, and wherein the width of said guidance zone varies such that the phase shift induced by said variation in width compensates for the phase shift induced by the variation in the coupling amplitude.

According to an advantageous characteristic of the invention, the diffraction grating is adapted to define extreme coupling at said extreme regions.

Preferably, said extreme regions of the diffraction grating coincide substantially with faces of the structure.

In one embodiment, the extremum is a minimum.

In another embodiment, the extremum is a maximum.

In which case, it is advantageous to cause the guidance zone width to increase from said extreme regions of the diffraction grating towards the center of the structure.

Preferably, the structure includes reflecting cleaved faces, having a reflection coefficient that is advantageously close to 30%.

Also preferably, the coupling amplitude varies in accordance with a cosine function.

Preferably, the length of the structure is greater than or equal to 600 μm.

Advantageously, the structure of the invention comprises an active zone formed by a stack of elementary layers that are alternately ternary and quaternary so as to define a multiple quantum well (MQW) zone.

Preferably, the structure is a so-called "buried-ridge" structure.

BRIEF DESCRIPTION OF THE DRAWINGS

Other characteristics and advantages of the invention appear on reading the following detailed description of a non-limiting embodiment of the invention, and on examining the accompanying drawings, in which:

FIG. 1 is a partially cutaway diagrammatic perspective view showing the diffraction grating of a laser diode structure of the invention;

FIG. 1A is a diagrammatic section view showing a detail of the way in which the active zone in a laser structure constituting a particular embodiment of the invention is built up;

FIG. 3 is a graph of curves that show how emitted power varies as a function of injected current and also showing the external differential quantum efficiency per face as a function of the injected current for a structure whose diffraction grating has patterns of varying length and constant width;

FIG. 4 shows how the effective refractive index varies along the structure because of variation in the length of the grating patterns;

FIGS. 5A to 5C show the spectra obtained from laser diode structures in which the diffraction gratings have patterns of varying length and of constant width;

FIG. 6 is a plan view showing the general appearance of a diffraction grating having patterns of constant length and of varying width;

FIG. 7 is a diagram showing how the effective refractive index varies due to variation in ridge width as shown in FIG. 6;

FIG. 8 is a plan view showing the general appearance of a diffraction grating of the invention having patterns that vary both in length and in width; and FIGS. 9A and 9B show the difference between the main mode and secondary modes for laser diode structures whose diffraction grating patterns are of variable length, respectively for patterns of constant width and for patterns of varying width.

MORE DETAILED DESCRIPTION

Figure 2:
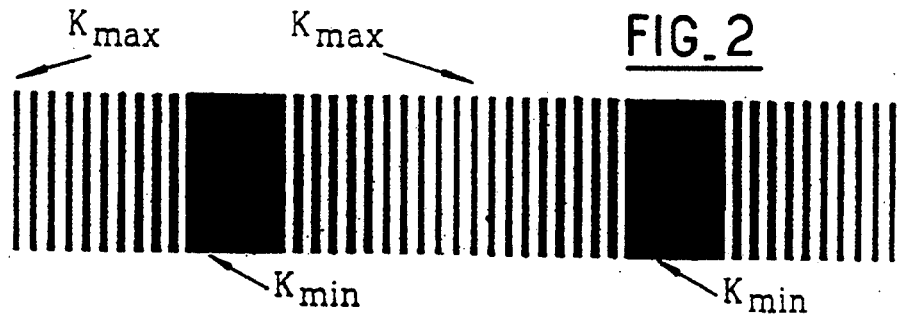
FIG. 2 is a diagram showing the interference fringes used for making the diffraction grating.

FIG. 1 is a diagram showing a laser structure of the invention in association with an orthogonal frame of reference XYZ.

Throughout the following description, reference is made to the Z axis as being the longitudinal axis, to the Y axis as being the horizontal transverse axis, and to the X axis as being the vertical transverse axis, and the terms "thickness", "width" and "length" refer to distances measured along the axes X, Y, and Z, respectively.

A distributed feedback laser diode structure of the type having a guidance zone providing lateral guidance by refractive index variation and in accordance with the invention, as shown in FIG. 1, is implemented using conventional techniques of metal organic vapor phase epitaxial growth (MOVPE). The process begins by growing the following successively on an N-doped indium phosphide (InP) substrate 100: a bottom confinement layer 110 of N-doped indium phosphide, typically having a thickness of the order of 2 micrometers; and then a set of elementary layers constituting an active zone 120 suitable for amplifying light. The active zone 120 is preferably formed by stacking elementary layers that are alternately of ternary material and of quaternary material, suitable for forming a set of multiple quantum wells and barriers (MQW).

Depending on the wavelength desired for laser emission, various parameters of the active zone 120 are adapted by the person skilled in the art, e.g. the number of elementary layers, the precise composition of the ternary and quaternary materials, the thicknesses of the elementary layers, etc.

Thus, in a non-limiting embodiment of the invention, for a desired wavelength of about 1.5 micrometers, and as shown diagrammatically in FIG. 1A, a first elementary layer 121 is deposited by epitaxy on the bottom confinement layer 110. The first elementary layer 121 has a thickness of 1250 Å and is made of quaternary material $Ga_{0.42} In_{0.58} As_{0.89} P_{0.11}$, followed by five 30 Å thick elementary layers 124 of ternary material $Ga_{0.47} In_{0.53} As$ alternating with 150 Å thick elementary layers 122 of quaternary material $Ga_{0.42} In_{0.58} As_{0.89} P_{0.11}$.

Thereafter, a layer 125 is deposited on the last epitaxially grown elementary layer 124, the layer 125 having identical composition and thickness to the layer 21, and it is covered with a layer of photosensitive resin in order to etch a diffraction grating thereon.

This photosensitive resin is preferably insolated with two systems of interference fringes of periods $L+dL/2$ and $L-dL/2$ that are slightly different, thereby achieving a moiré effect similar to that shown by way of illustration in FIG. 2.

The dark zones referenced $K_{min}$ are zones where the patterns 1200 of the diffraction grating are of minimum length and the pale zones $K_{max}$ are zones where the patterns of the grating are of maximum length.

Figure 2A:
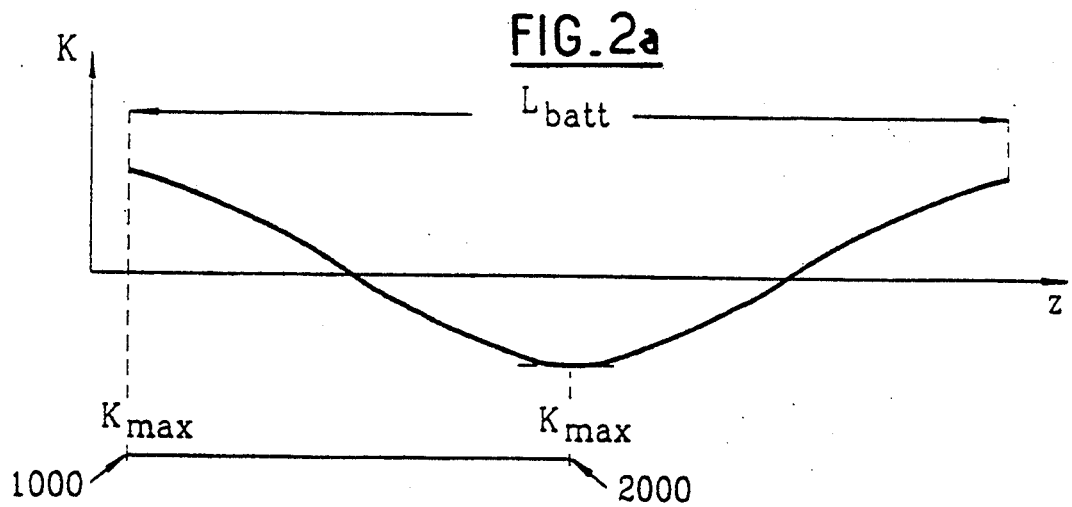
FIG. 2A shows how coupling amplitude varies in a structure comprising a first embodiment of the invention having a diffraction grating obtained from interference fringes as shown in FIG. 2.
Figure 2C:
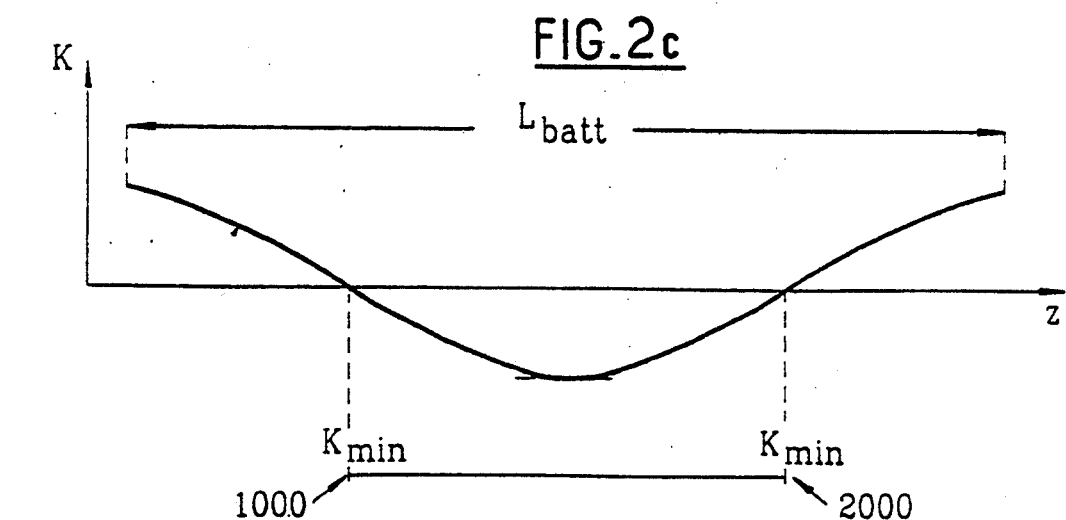
FIG. 2C shows how the coupling amplitude varies in a structure constituting a second embodiment of the invention and obtained from interference fringes such as those shown in FIG. 2.
Figure 2B:
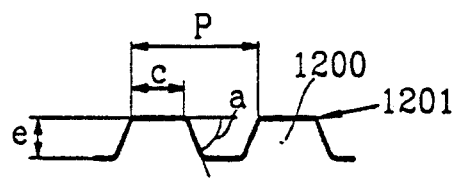
FIG. 2B is a diagram in longitudinal section showing the appearance of the patterns of a diffraction grating implemented by chemical etching.

It should be observed that the "length" of a pattern is its size measured parallel to the propagation direction Z of light through the structure, as specified in the description given with reference to FIG. 2B. The variation in the coupling amplitude K that results from modulating the length of the diffraction grating patterns 1200 is shown in FIG. 2A, and it may be described by a cosine function: $K=K_0.\cos(2\pi z/L_{batt})$ where $L_{batt}=L^2/dL$, and with $K_0$ being a constant whose value is specified below.

After insolation, the diffraction grating is etched chemically using conventional photolithographic methods.

As can be observed from FIG. 1, the patterns 120 of the diffraction grating extend transversely to the propagation direction Z of a lightwave through the laser structure. The electric field vector of the lightwave extends parallel to the Y axis in the looked-for mode of laser oscillation.

Thereafter, the grating is etched on the layer 125 and the active zone 120 is etched to form a ridge.

The ridge is preferably etched using reactive ion beam etching (RIBE) by interposing a suitable lithographic mask between the structure to be etched and the source of ions.

In accordance with a characteristic of the invention, the resulting ridge preferably has a width that varies, as described below.

The mean width of the ridge formed in this way is preferably about 1.7 micrometers, thereby ensuring monomode operation for the laser.

After etching the ridge, a second epitaxial stage is performed in which a top confinement layer 130 of P-doped indium phosphide InP is grown to a thickness of about 1.5 micrometers, followed by a layer 140 of heavily P-doped GaInAs ternary material to a thickness of about 0.5 micrometers.

Ohmic contacts 150 are made by metallization using conventional techniques, and leakage current is limited by implanting protons in regions 1500 situated on either side of the ridge, as represented by shading in FIG. 1.

A buried ridge structure is thus obtained, the ridge constituting a guidance zone providing lateral guidance by refractive index variation in the embodiment described.

Light is confined laterally in the ridge, i.e. between the two faces of the ridge that extend in the direction of the longitudinal axis Z, and substantially parallel to the vertical direction X, by index variation between the index of the various layers constituting the active zone and the lower index of the upper confinement layer 130.

Finally, the end faces 1000 and 2000 of the laser structure are made by cleaving, with the length of the structure being advantageously greater than 600 μm.

The end faces 1000 and 2000 preferably have a reflection coefficient of about 30%.

As a result, a large portion of the light leaving via one face of the structure is reflected back into the structure and participates in the feedback necessary for the lasing phenomenon, such that the threshold current $I_s$ is reduced.

Where appropriate, the end faces 1000 and 2000 are given anti-reflection treatment which, in addition to requiring an additional technological step, increases the threshold current $I_s$ relative to a structure having reflecting cleaved faces.

However, the emitted light power is greater, and in general, whether or not to provide anti-reflection treatment on the end faces depends on a compromise with respect to the intended end-use for the laser, i.e. depending on whether emitted power or low threshold current is the more important.

In accordance with the invention, and as described below, the patterns 1200 of the diffraction grating in the longitudinally extreme end regions of the diffraction grating (that preferably coincide with the end faces 1000 and 2000 of the structure) have a length that is determined in such a manner that coupling between the go wave and the return wave within the structure is at an extreme value in said longitudinally extreme regions of the diffraction grating. The appearance of the patterns obtained by chemical etching is shown diagrammatically and in longitudinal section in FIG. 2B.

The geometrical characteristics of the diffraction grating, and in particular the depth of the patterns 1200 and the grating pitch, are selected as a function of the desired coupling K, with the depth of the grating patterns, i.e. their size in the vertical direction X, preferably lying in the range 300 Å to 700 Å. The pitch P of the grating preferably corresponds to (wavelength emitted in air)/2.$n_{eff}$ where $n_{eff}$ is specified below. The angle a is equal to about 54°, being defined by the (111)A planes that the chemical etching causes to appear.

The coupling achieved by the pattern 1200 of the grating depends on the length c of the plateau-shaped top 1201 thereof, and also on its depth e. In general, the coupling passes through a maximum for a given plateau length c′ for each given depth e, and decreases for plateau lengths that are greater than or less than said value.

The diffraction grating is referred to as being "phase-shifting" since the lightwave propagating along it is subjected to a phase shift.

For optimum operation of the laser, the total phase shift to which the lightwave is subjected along the diffraction grating is equal to π, and the frequency at which the lightwave propagates is then called the Bragg frequency.

In a preferred first embodiment of the invention, as shown in FIG. 2A, the diffraction grating extends along the entire length of the structure and the end faces 1000 and 2000 thereof are positioned relative to the fringes of FIG. 2 in such a manner that the lengths of the plateaux 1201 of the grating are equal to c′ at the end faces of the cavity. As a result, the coupling between the go wave and the return wave is at a maximum at said end faces, and, correspondingly, the coupling is at a minimum in the central region of the structure. Several advantages stem from this configuration, including that of limiting the effect of the phase shift of the lightwave on reflection at the faces, since the proportion of the lightwave that reaches the end faces is reduced by greater backscattering in the vicinity thereof; there is therefore no need to apply anti-reflection treatment to the end faces 1000 and 2000.

In addition, by implementing low amplitude coupling in the central region of the structure, where the electric field of the lightwave is particularly high, the electric field is made more uniform along the structure and instability phenomena due to "hole-burning" are reduced.

A structure of the invention thus makes it possible to have high power monomode operation (at about 80 mW) while obtaining good linearity of emitted power as a function of injected current.

FIG. 3 shows an experimental curve P showing how emitted power (plotted up the lefthand scale) varies as a function of injected current (plotted along the horizontal axis), and on examination of this figure, it can be seen that very good linearity is obtained with a structure of the invention, in which coupling amplitude varies as shown in FIG. 2A, where $K_0 = 80$ cm$^{-1}$ and the length l of the structure is 640 μm.

In addition, it can be seen that the curve R showing external differential quantum efficiency per face (plotted up the righthand scale) as a function of injected current (plotted along the horizontal scale) varies little about a mean value of about 0.25 mW/mA, which, given the relatively large value of the amplitude of the mean coupling $K_m l$ for this structure $$K_m 1 = \int_0^1 K(z)dz = 3.3$$

tells the person skilled in the art that the "hole-burning" phenomenon is absent.

A strong "hole-burning" phenomenon is encountered in conventional laser diode structures of comparable mean coupling amplitude $K_m l$ and of constant coupling amplitude.

It is preferable for the length difference between patterns of the grating at the end faces and in the central region of the structure to be at a maximum, and in the particular case of cosine function variation, the length l of the structure should be selected to be substantially equal to $L_{batt}/2$, where $L_{batt}$ is as defined above.

In a second embodiment of the invention as shown in FIG. 2B, it is also possible to position the interference fringes used while etching the diffraction grating in such a manner that the plateaux 1201 are of a length other than c′ in the end regions of the diffraction grating, which end regions preferably coincide with the faces 1000 and 2000 of the structure, while being close to c′ in the central region thereof. Maximum coupling is thus achieved at the center with minimum coupling in the end regions of the grating. The Applicant has observed that under such circumstances, and unexpectedly, rejection of secondary modes is improved since the difference between the currents at the threshold of the main and secondary modes is increased.

In accordance with the invention, the width of the ridge varies along the longitudinal direction Z to compensate the phase shift induced by the variation in the coupling amplitude.

In the equations describing the coupling and the confinement of the electric field of the lightwave it can be shown that given sufficiently different dimensions of thickness and of width of the ridge, everything takes place as though it were possible to decouple everything that depends on X (vertical confinement and coupling) from everything that depends on Y (lateral confinement), which is the direction parallel to the orientation of the electric field in the structure. Calculating the effective refractive index $n_{eff}$ of the structure as seen by the propagating wave is directly related to the phenomenon of coupling between the go wave and the return wave and therefore does not make reference to the variables Z and X.

FIG. 4 is a diagram showing how the effective refractive index $n_{eff}$ varies as a function of the longitudinal coordinate Z in a structure whose diffraction grating patterns 1200 are of constant width and of a length that provides maximum coupling close to the end faces of the structure.

This variation in effective refractive index is accompanied by a phase shift of the lightwave that has the effect of making mutual interference between the go wave and the return wave within the structure less constructive, and consequently, as observed by Morthier in the above-mentioned article, of reducing rejection of secondary modes.

FIGS. 5A, 5B, and 5C correspond to the emission spectra obtained with structures for which the coupling amplitude is at a maximum close to the end regions of the diffraction grating, but for which the width of the ridge is constant. These spectra were obtained respectively with injection currents of $0.9I_s$, $4I_s$, and $20I_s$ (where $I_s$ is close to 25 mA). Powers of 22.5 mW and 78 mW were obtained for injection currents of $4I_s$ and $20I_s$, respectively. The length of the laser is 650 μm. Its two faces have been subjected to anti-reflection treatment and make it possible to interpret the spectrum in the vicinity of the threshold as resulting solely from the influence of the diffraction grating, without any contribution from the faces. The person skilled in the art will note that the spectrum observed in the vicinity of the threshold (FIG. 5B) does not have the stop-band characteristic of structures for which there is no phase shift induced by variation in coupling amplitude, and for which the phase shift induced by the diffraction grating is therefore exactly $\pi$.

According to the invention, the width of the ridge varies in such a manner that the resulting variation in the refractive index of the ridge compensates for the variation in the effective refractive index due to the variation in coupling amplitude, thereby making it possible for the lightwave to propagate through the structure at the Bragg frequency for which the threshold current $I_s$ is a minimum and for which the monochromaticity of the emitted spectrum is the best. By way of illustration, FIG. 7 shows how the effective refractive index of the tape $n_{eff\ ridge}$ varies as a function of the longitudinal coordinate Z as a result of variation in the width of the ridge as shown in FIG. 6, for a diffraction grating whose patterns 1200 are of constant length.

On comparing FIGS. 4, 6, and 7, the person skilled in the art will easily deduce that by using a ridge of variable width as shown in FIG. 8, it is possible to compensate variation in effective refractive index $n_{eff}$ obtained for a diffraction grating whose patterns are of varying length and of constant width by variation in the refractive index $n_{eff\ ridge}$ as obtained with a diffraction grating whose patterns are of constant length and varying width.

Variation in the width of the ridge is obtained in continuous or discontinuous manner depending on the geometrical characteristics of the diffraction grating of the structure. The width of the ridge thus preferably lies in the range 1.5 μm to 1.9 μm, it being understood that these dimensions may be selected at will by the person skilled in the art.

Phase shift compensation obtained by varying coupling amplitude in the propagation direction of the lightwave by varying the width of the ridge considerably improves rejection of secondary modes, as can easily be seen by the person skilled in the art on comparing FIGS. 9A and 9B.

These figures show the results of simulation on a structure whose coupling amplitude is modulated by a cosine function, being at a maximum at the longitudinal ends of the grating, the width of the ridge being constant, and for a structure of the invention in which coupling amplitude is modulated in the same way, but for varying ridge width.

In FIGS. 9A and 9B, the vertical axis has a normalized magnitude $\Delta\alpha.1$ plotted therealong representing the difference between the thresholds of the main and secondary modes, and the horizontal axis has a normalized magnitude $\Delta\beta.1$ plotted therealong representing the frequency shift relative to the Bragg frequency at which $\Delta\beta.1=0$.

On examining FIGS. 9A and 9S, it will be observed that a structure of the invention makes it possible to obtain ten times greater secondary mode rejection in this example.

Finally, the invention makes it possible to implement structures of considerable length, advantageously greater than 600 μm, which structures provide stable operation, good rejection of secondary modes, and increase monochromaticity.

The buried ridge structure described above constitutes merely a non-limiting example of a structure of the invention.

Without going beyond the ambit of the invention, it is possible to propose other structures of the type providing lateral guidance by refractive index variation. For example, the structure may be a double channel planar buried heterostructure (DCPBH), a channel substrate buried heterostructure (CSBH), etc.

We claim:

1. A distributed feedback semiconductor laser structure of the type having a guidance zone providing lateral guidance by refractive index variation, including a phase-shifting diffraction grating extending parallel to a longitudinal Z axis between two end regions along a light propagation direction, for obtaining coupling within the structure between light propagating in one direction and light propagating in the opposite direction, said diffraction grating including patterns distributed along the structure and generally parallel to a Y axis extending transversely to said light propagation direction wherein the geometrical characteristics of the patterns of the diffraction grating are chosen so as to implement coupling of varying amplitude along the longitudinal Z axis of the structure between said end regions, and wherein a width of said guidance zone measured parallel to said Y axis varies when considered along the longitudinal Z axis such that a phase shift induced by said variation in width compensates for a phase shift induced by the variation in the coupling amplitude.

2. A laser structure according to claim 1, wherein the diffraction grating is adapted to define extreme coupling at said end regions.

3. A laser structure according to claim 2, characterized in the diffraction grating is adapted to define minimum coupling at said end regions.

4. A laser structure according to claim 2, wherein the diffraction grating is adapted to define maximum coupling at said end regions.

5. A laser structure according to claim 1, wherein said end regions of the diffraction grating coincide substantially with faces of the structure.

6. A laser structure according to claim 4, wherein the width of the guidance zone increases from said end regions of the diffraction grating towards the center of the structure.

7. A laser structure according to claim 1, wherein the structure includes reflecting cleaved faces.

8. A laser structure according to claim 7, wherein the cleaved faces have a reflection coefficient of about 30%.

9. A laser structure according to claim 1, wherein the coupling amplitude varies in accordance with a cosine function.

10. A laser structure according to claim 1, wherein the length of the structure is greater than or equal to 600 $\mu$m.

11. A laser structure according to claim 1, wherein the coupling amplitude is caused to vary by varying the length of diffraction grating patterns.

12. A laser structure according to claim 1, comprising an active zone formed by a stack of elementary layers of alternating ternary and quaternary materials in such a manner as to define a multiple quantum well zone.

13. A laser structure according to claim 1, wherein the structure is a "buried ridge" structure.

14. A distributed feedback semiconductor laser structure having a guidance zone providing lateral guidance by refractive index variation, including a phase-shifting diffraction grating extending parallel to a longitudinal Z axis between two end regions along a light propagation direction, for obtaining coupling within the structure between light propagating in one direction and light propagating in the opposite direction, said diffraction grating including patterns distributed along the structure and generally parallel to a Y axis extending transversely to said light propagation direction wherein the coupling amplitude varies between said end regions by varying the length of diffraction grating patterns measured parallel to the longitudinal Z axis, and wherein a width of said guidance zone measured parallel to said Y axis varies when considered along the longitudinal Z axis such that a phase shift induced by said variation in width compensates for a phase shift induced by the variation in the coupling amplitude.

15. A distributed feedback semiconductor laser structure having a guidance zone providing lateral guidance by refractive index variation, including a phase-shifting diffraction grating extending parallel to a longitudinal Z axis between two end regions along a light propagation direction, for obtaining coupling within the structure between light propagating in one direction and light propagating in the opposite direction, said diffraction grating including patterns distributed along the structure and generally parallel to a Y axis extending transversely to said light propagation direction wherein the geometrical characteristics of the patterns of the diffraction grating are chosen so as to implement coupling of varying amplitude along the longitudinal Z axis of the structure between said end regions, wherein a width of said guidance zone measured parallel to said Y axis varies when considered along the longitudinal Z axis such that a phase shift induced by said variation in width compensates for a phase shift induced by the variation in the coupling amplitude, and wherein the structure includes reflecting cleaved faces.

* * * * *